(12) United States Patent
Li et al.

(10) Patent No.: US 7,787,250 B2
(45) Date of Patent: Aug. 31, 2010

(54) METALLIC COVER OF MINIATURIZATION MODULE

(75) Inventors: Kuan-Hsing Li, Nan-Tou (TW); Kuo-Hsien Liao, Nan-Tou (TW)

(73) Assignee: Universal Scientific Industrial (Shanghai) Co., Ltd., Shanghai (CN)

( * ) Notice: Subject to any disclaimer, the term of this patent is extended or adjusted under 35 U.S.C. 154(b) by 312 days.

(21) Appl. No.: 12/003,520

(22) Filed: Dec. 28, 2007

(65) Prior Publication Data

US 2009/0166830 A1   Jul. 2, 2009

(51) Int. Cl.
*H05K 7/20* (2006.01)

(52) U.S. Cl. ............... 361/715; 361/816; 361/720; 361/722

(58) Field of Classification Search ............ 361/692, 361/708, 714, 716–720, 800, 816, 818, 715, 361/722, 723; 257/704, 705, 712, 787
See application file for complete search history.

(56) References Cited

U.S. PATENT DOCUMENTS

| | | | | |
|---|---|---|---|---|
| 4,801,998 A * | 1/1989 | Okuaki | ............ | 257/681 |
| 5,365,107 A * | 11/1994 | Kuraishi et al. | ............ | 257/673 |
| 5,530,202 A * | 6/1996 | Dais et al. | ............ | 174/385 |
| 5,909,057 A * | 6/1999 | McCormick et al. | ...... | 257/704 |
| 5,977,626 A * | 11/1999 | Wang et al. | ............ | 257/707 |
| 5,982,621 A * | 11/1999 | Li | ............ | 361/704 |
| 6,433,420 B1 * | 8/2002 | Yang et al. | ............ | 257/712 |
| 6,504,095 B1 * | 1/2003 | Hoffstrom | ............ | 174/520 |
| 6,614,102 B1 * | 9/2003 | Hoffman et al. | ............ | 257/666 |
| 6,707,168 B1 * | 3/2004 | Hoffman et al. | ............ | 257/796 |
| 6,757,181 B1 * | 6/2004 | Villanueva et al. | ....... | 361/816 |
| 6,818,476 B2 * | 11/2004 | Yonemochi | ............ | 438/122 |
| 6,826,053 B2 * | 11/2004 | Kato et al. | ............ | 361/715 |
| 6,882,041 B1 * | 4/2005 | Cheah et al. | ............ | 257/704 |
| 6,891,259 B2 * | 5/2005 | Im et al. | ............ | 257/687 |
| 7,122,911 B2 * | 10/2006 | Yang | ............ | 257/796 |
| 7,196,415 B2 * | 3/2007 | Zhong et al. | ............ | 257/712 |
| 7,224,057 B2 * | 5/2007 | Yang | ............ | 257/707 |
| 7,256,493 B2 * | 8/2007 | Meyer-Berg | ............ | 257/713 |
| 7,480,153 B2 * | 1/2009 | Kong | ............ | 361/818 |

FOREIGN PATENT DOCUMENTS

TW          00297932          2/1997

\* cited by examiner

*Primary Examiner*—Dameon E Levi
(74) *Attorney, Agent, or Firm*—Kile Goekjian Reed & McManus PLLC

(57) ABSTRACT

A metallic cover of a miniaturization module includes a substrate, a SMD chip unit and a metallic cover, the metallic cover embracing the SMD chip unit and having at least one sizing hole and a plurality of venting holes, the venting holes being disposed around the sizing hole, and the sizing hole and the venting holes being positioned above the SMD chip unit so that glue portions fill up slits between the metallic cover and the SMD chip unit. The venting holes stop the glue portion from running over the second chip unit. The glue-filled slits between the top lid and the SMD chip unit provides a strong support to prevent any deformation of the metallic cover when the metallic cover is tested and processed.

7 Claims, 6 Drawing Sheets

METALLIC COVER OF MINIATURIZATION MODULE

BACKGROUND OF THE INVENTION

1. Field of the Invention

The invention generally relates to a metallic cover, especially to a metallic cover for a metallic cover of miniaturization module.

2. Description of the Related Art

A prior chip module such as Surface Mount Technology (SMT) module including chip unit such as SMD and a metallic cover is mounted on a substrate. The metallic cover covers the SMD and is soldered onto the substrate as a shield for the chip unit to prevent any EMI effect and promote heat dissipation. TW Patent publication No. 297932 disclose SMT chip modules.

For the trend of miniaturization of the chip module, the prior metallic cover will need to reduce its soldering area, which will adversely affect the mechanical strength of the metallic cover and the chip unit under the metallic cover will tend to be damaged due to the deformation of the metallic cover during test.

Furthermore, the metallic cover of the SMT chip module is soldered onto the substrate. The metallic cover will be separated during processing, causing problems such as not easily disassembled from the mother board.

SUMMARY OF THE INVENTION

It is an object of the invention to provide a metallic cover of a miniaturization module with minimal welding area, which the metallic cover has improved mechanical strength so that the metallic cover is not easily deformed and SMD chip units under the metallic cover can be protected, while there would not be a problem about delamination of the metallic cover in disassembly.

In order to achieve the above and other objectives of the invention, a metallic cover of a miniaturization module includes a substrate, a SMD chip unit and a metallic cover, the metallic cover embracing the SMD chip unit and having at least one sizing hole and a plurality of venting holes, the venting holes being disposed around the sizing hole, and the sizing hole and the venting holes being positioned above the SMD chip unit so that glue portions fill up slits between the metallic cover and the metallic chip unit.

The metallic cover has at least one sizing hole at its center above the first SMD chip unit, and further has a plurality of venting holes around the sizing hole within the area aligning with the first chip unit. With this configuration, the venting holes stop the glue portion from running over the second chip unit which has weaker mechanical strength than the first chip unit. In this way, other electronic elements can be protected from being glued.

The glue-filled slits between the top lid and the first SMD chip unit provides a strong support to prevent any deformation of the metallic cover when the module is under test with test fixture or other processes which will cause stress on the metallic cover. Therefore, the chip units, especially for the second SMD chip unit with weaker mechanical strength, embraced by the metallic cover can protected. In addition, the height of the metallic cover can be further reduced because of reducing deformation of the metallic cover can save more headroom for weaker SMD chips.

For a miniaturization chip module of the invention, the reduced welded area of the metallic cover allows the achievement of miniaturization which in turns increases the product competitiveness The glue portion enhances the bonding between the metallic cover and the substrate. Therefore, when the client disassembles the SMD chip unit during processing, it would not cause problem due to the delamination of the metallic cover from the module. Furthermore, the glue portion offers the SMD chip unit another path for transmitting heat out through the metallic cover.

To provide a further understanding of the invention, the following detailed description illustrates embodiments and examples of the invention, this detailed description being provided only for illustration of the invention.

DETAILED DESCRIPTION OF THE EMBODIMENTS

Figure 1:
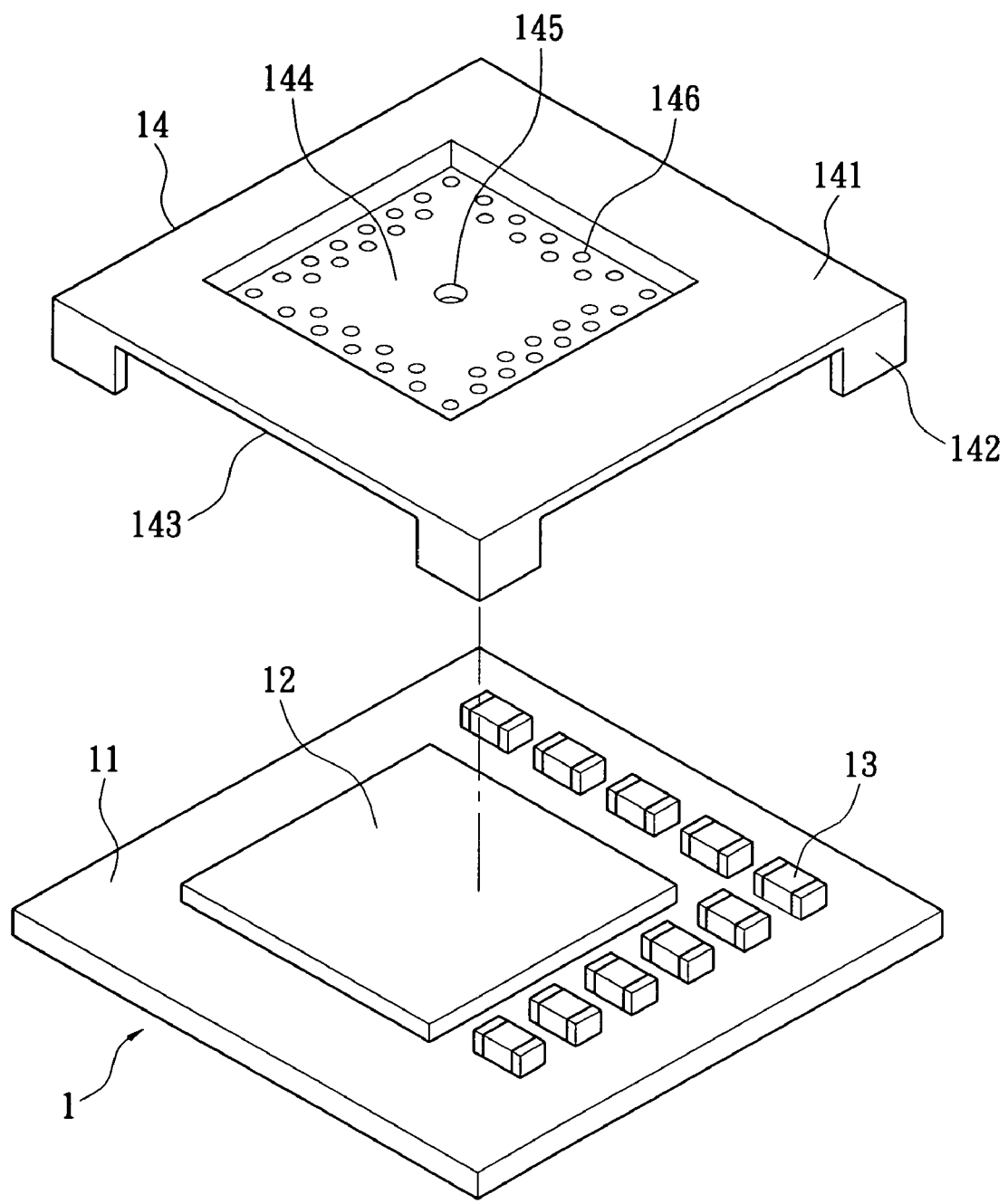
FIG. 1 is perspective view showing a disassembly of a chip unit and a metallic cover according to one embodiment of the invention.
Figure 2:
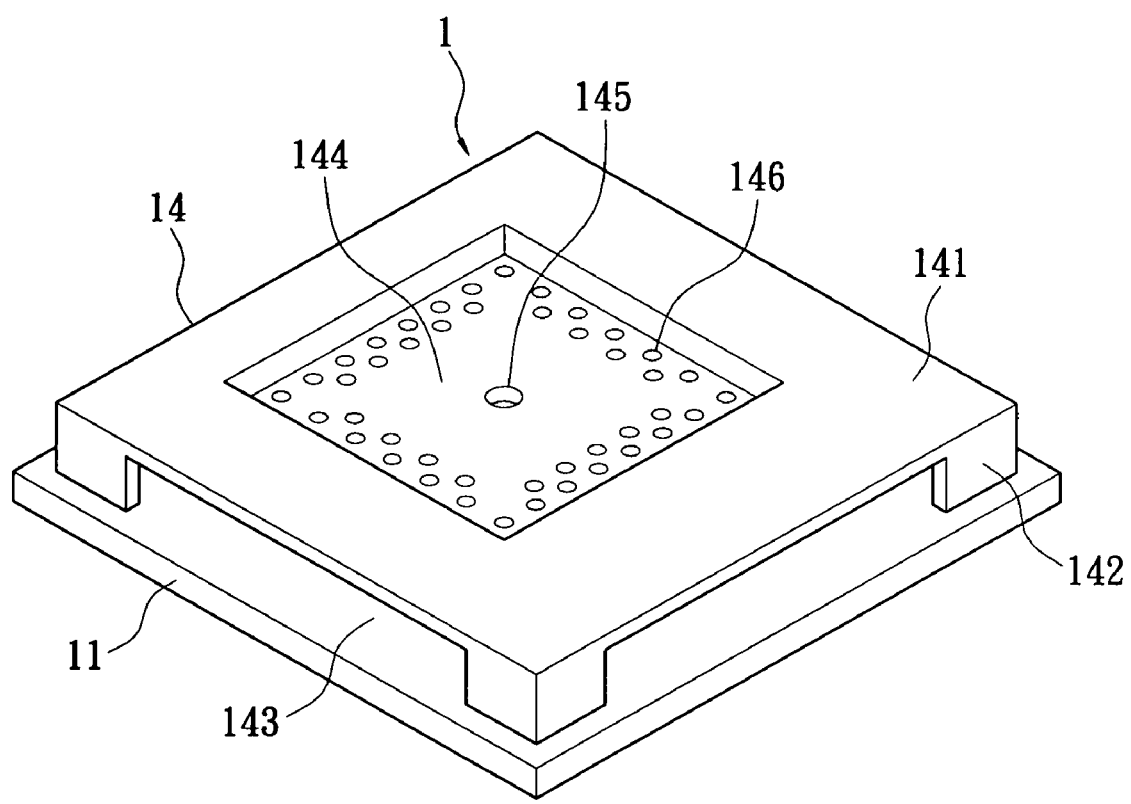
FIG. 2 is a perspective view showing an assembly of a chip unit and a metallic cove according to one embodiment of the invention.
Figure 3:
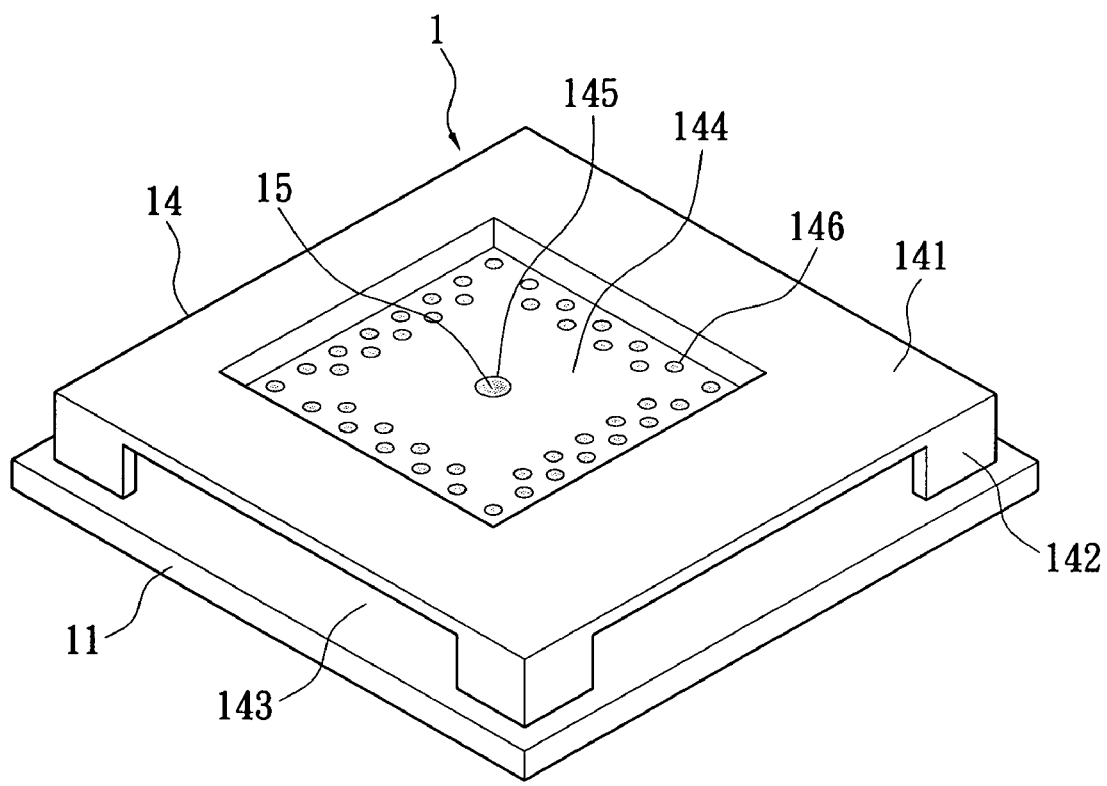
FIG. 3 is a perspective view of a chip module with glue portions between the chip unit and the metallic cover according to one embodiment of the invention.
Figure 4:
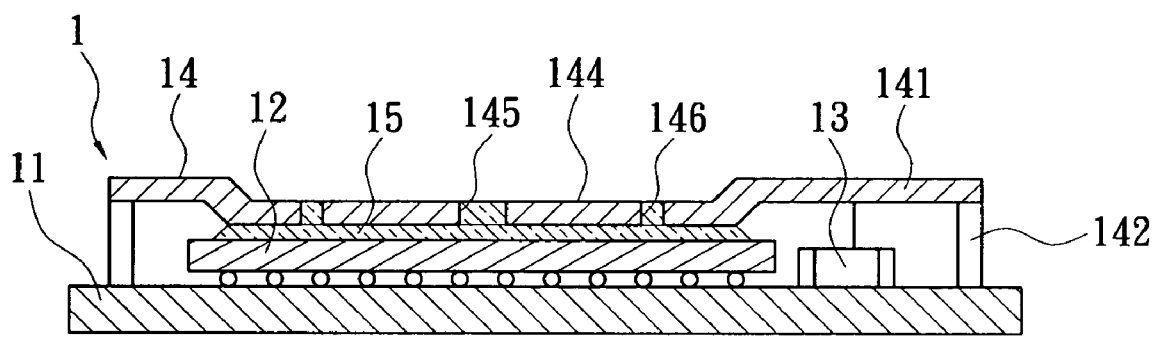
FIG. 4 is a cross sectional view of a chip module with glue portions between the chip unit and the metallic cover according to one embodiment of the invention.

Wherever possible in the following description, like reference numerals will refer to like elements and parts unless otherwise illustrated.

Referring to FIG. 1 through FIG. 4, a metallic cover of a miniaturization module 1 includes a substrate 11, a first SMD chip unit 12, a plurality of second SMD chip unit 13, a metallic cover 14 and glue portions 15. The firs t and second SMD chip unit 12, 13 are assembled on a front surface of the substrate 11. The first SMD chip unit 12 offers great mechanical strength and is has a proper height. The first SMD chip unit 12 can be QFN, TSSOP or flip chip format SMD chip unit.

The metallic cover 14 includes a top lid 141 and a plurality of side sheets 142 extending downward from a periphery of the top lid 14. An opening 143 is defined between two of the side sheets 142 so that the metallic lid 14 is prevented from contacting the first and the second SMD chip units 12, 13, reducing the areas of the metallic lid 14 and the substrate 11. The metallic lid 14 is mounted onto the front surface of the substrate 11 to cover the first and the second SMD chip units 112, 13. A lower edge of the side sheets 142 is welded to the substrate 11, leaving the minimum welding point.

A recess 144 is formed on an exposed surface of the top lid 14 in a manner to map to the first SMD chip unit 12. In one embodiment, the first SMD chip unit 12 has a rectangular top and the recess 144 has a rectangular bottom.

The recess 144 of the metallic cover 14 has at least one sizing hole 145. The number of the sizing hole is not particularly limited. In this embodiment, the recess 144 has one sizing hole 145 at its center through the top lid 141. A plurality of venting holes 146 is disposed along an inner edge of the recess 144 around the sizing hole 145 and penetrates through the top lid 141. The venting holes 146 and the sizing hole 145 are positioned above the first chip unit 12. The shapes of the venting holes and the sizing holes are not particularly limited. In this embodiment, the sizing hole 145 and the venting holes 146 are round shaped.

The glue portion 15 is made of thermally conductive material such as epoxy. The glue portion is filled up in gaps between the top lid 141 and the first SMD chip unit 12, and is hardened after baking. The venting hole 146 restricts the glue portion 15 from running over to the second chip unit 13 due to the surface tension of the glue while the glue portion 15 is filled with glue portion. Therefore, the glue portion 15 is only allowed to exist between the first chip unit 12 and the recess 144 of the top lid 141.

Figure 5:
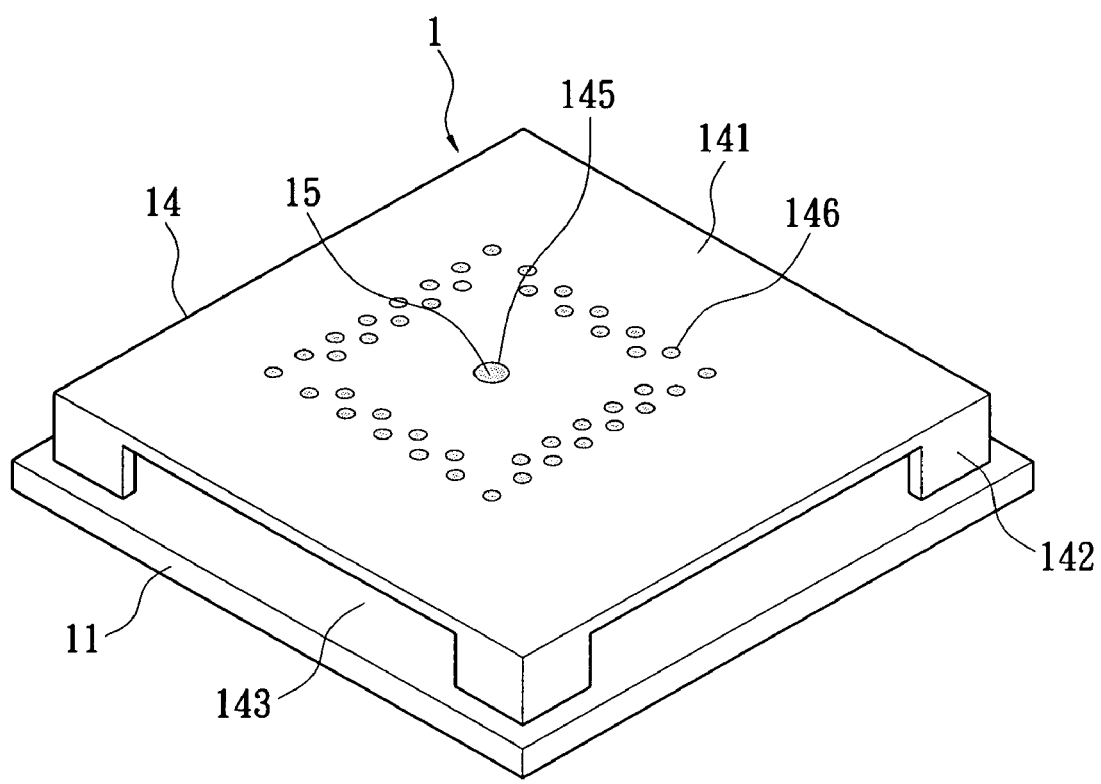
FIG. 5 is a perspective view of a chip module with glue portions between the chip unit and the metallic cover according to another embodiment of the invention.
Figure 6:
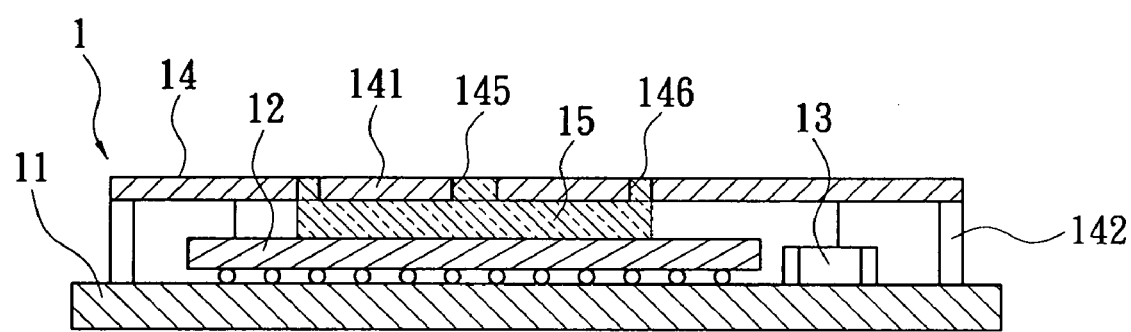
FIG. 6 is a cross sectional view of a chip module with glue portions between the chip unit and the metallic cover according to another embodiment of the invention.

Referring to FIG. 5 and FIG. 6, if the first SMD chip unit 12 is too high to tolerate the presence of the recess 141, then the recess 141 can be omitted. In this case, the top lid 141 is flat and the sizing hole 145 and the venting holes 146 are be formed through the flat top lid 141, rather than through the recess 144. The sizing hole 145 corresponds to a center of the first SMD chip unit 12, and the venting holes 146 are positioned within an area aligning with the first SMD chip unit 12. As such, glue portion 15 is filled up in the slits between the top lid 144 and the first SMD chip unit 12. The venting holes 146 stop the glue portion 15 from running over the second chip unit 13 due to the surface tension of glue.

In the present invention, the metallic cover 14 has at least one sizing hole 145 at its center above the first SMD chip unit 12, and further has a plurality of venting holes 146 around the sizing hole 145 within the area aligning with the first chip unit 12. With this configuration, the venting holes 146 stop the glue portion 15 from running over the second chip unit 13 which has weaker mechanical strength than the first chip unit 12. In this way, other electronic elements can be protected from being glued.

The glue-filled slits between the top lid 141 and the first SMD chip unit 12 provides a strong support to prevent any deformation of the metallic cover 14 when the module is under test with test fixture or other processes which will cause stress on the metallic cover. Therefore, the chip units, especially for the second SMD chip unit with weaker mechanical strength, embraced by the metallic cover 14 can protected. In addition, the height of the metallic cover 14 can be further reduced because of reducing deformation of the metallic cover can save more headroom for weaker SMD chips.

For a miniaturization chip module of the invention, the reduced welded area of the metallic cover 14 allows the achievement of miniaturization which in turns increases the product competitiveness.

The glue portion 15 enhances the bonding between the metallic cover 14 and the substrate 11. Therefore, when the client disassembles the SMD module 1 during processing, it would not cause problem due to the delamination of the metallic cover. Furthermore, the glue portion 15 offers the SMD chip unit 12 another path for transmitting heat out through the metallic cover 14.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A miniaturization chip module, comprising:
a substrate;
at least one surface-mount device (SMD chip unit having a peripheral edge and mounted on said substrate;
a metallic cover having a top lid and a plurality of side sheets extending at a periphery of said top lid towards said substrate, said metallic cover being positioned with said top lid thereof above said at least one SMD chip unit and with lower edges of said plurality of side sheets secured to said substrate in surrounding relationship with said at least one SMD chip unit, wherein said top lid has at least one sizing hole and a plurality of venting holes formed thereat, the venting holes being disposed around the sizing hole, wherein the sizing hole and the venting holes are positioned above the SMD chip unit, and wherein a glue receiving gap is formed between a portion of said top lid having said sizing hole and said plurality of venting holes and a top surface of said at least one SMD chip unit; and
a glue, said glue filling said glue receiving gap between said top lid of said metallic cover and said top surface of said at least one SMD chip unit, said plurality of venting holes preventing said glue from escaping beyond said peripheral edge of said at least one SMD chip unit.

2. The miniaturization chip module of claim 1, wherein the metallic cover further has an opening defined between two of the side sheets, and wherein the sizing hole and the venting holes are formed through the top lid.

3. The miniaturization chip module of claim 1, wherein said lower edges of said side sheets of the metallic cover are welded to the substrate.

4. The miniaturization chip module of claim 1, wherein the metallic cover above the SMD chip unit has a recess, the sizing hole being located at a center of the recess and the venting holes being positioned along an inner edge of the recess.

5. The miniaturization chip module of claim 4, wherein the recess has an area smaller than the SMD chip unit.

6. The miniaturization chip module of claim 1, wherein the sizing hole aligns with a center of the SMD chip unit and the venting holes are located within an area corresponding to the SMD chip unit.

7. The miniaturization chip module of claim 1, wherein the glue includes epoxy.

* * * * *